(12) United States Patent
Yuan

(10) Patent No.: US 11,061,085 B2
(45) Date of Patent: Jul. 13, 2021

(54) MAGNETIC FIELD SENSING APPARATUS

(71) Applicant: Fu-Te Yuan, New Taipei (TW)

(72) Inventor: Fu-Te Yuan, New Taipei (TW)

(73) Assignee: iSentek Inc., New Taipei (TW)

( * ) Notice: Subject to any disclaimer, the term of this patent is extended or adjusted under 35 U.S.C. 154(b) by 40 days.

(21) Appl. No.: 16/519,007

(22) Filed: Jul. 23, 2019

(65) Prior Publication Data

US 2020/0300937 A1 Sep. 24, 2020

Related U.S. Application Data

(60) Provisional application No. 62/819,679, filed on Mar. 18, 2019.

(30) Foreign Application Priority Data

May 31, 2019 (TW) .................................. 108118893

(51) Int. Cl.
*G01R 33/09* (2006.01)
*G01R 33/00* (2006.01)
*G01R 17/10* (2006.01)

(52) U.S. Cl.
CPC ......... *G01R 33/09* (2013.01); *G01R 33/0023* (2013.01); *G01R 17/105* (2013.01)

(58) Field of Classification Search
CPC .............. G01R 33/0011; G01R 33/093; G01R 33/098; G01R 15/185; G01R 15/205;
(Continued)

(56) References Cited

U.S. PATENT DOCUMENTS

2013/0320972 A1* 12/2013 Loreit ................. G01R 33/093
324/252
2015/0285873 A1* 10/2015 Cai ........................ G01R 33/00
324/252

(Continued)

FOREIGN PATENT DOCUMENTS

CN 105261699 1/2016
TW 201640134 11/2016

*Primary Examiner* — Huy Q Phan
*Assistant Examiner* — Adam S Clarke
(74) *Attorney, Agent, or Firm* — JCIPRNET

(57) ABSTRACT

A magnetic field sensing apparatus including a substrate, a plurality of magnetoresistance sensors and a plurality of magnetization direction setting devices is provided. A surface of the substrate includes a plurality of inclined surfaces and a plane surface. The magnetoresistance sensors include a plurality of first magnetoresistance sensors disposed at the inclined surfaces and a plurality of second magnetoresistance sensors disposed at the plane surface. The first magnetoresistance sensors include a first and a third portions and form a first full Wheatstone Bridge. The second magnetoresistance sensors include a second and a fourth portions and form a second full Wheatstone Bridge. The magnetization direction setting devices include a first and a second magnetization direction setting devices. The first magnetization direction setting device is disposed beside and overlaps with the first and the second portions. The second magnetization direction setting device is disposed beside and overlaps with the third and the fourth portions.

9 Claims, 3 Drawing Sheets

(58) Field of Classification Search
CPC .. G01R 17/10; G01R 17/105; G01R 33/0005; G01R 33/0023; G01R 33/0094; G01R 33/09; G01R 33/091
See application file for complete search history.

(56) References Cited

U.S. PATENT DOCUMENTS

| | | | |
|---|---|---|---|
| 2016/0109532 A1 | 4/2016 | Fu | |
| 2016/0327618 A1* | 11/2016 | Yuan | G01C 17/28 |
| 2017/0108559 A1* | 4/2017 | Yuan | G01R 33/098 |

* cited by examiner

MAGNETIC FIELD SENSING APPARATUS

CROSS-REFERENCE TO RELATED APPLICATION

This application claims the priority benefits of U.S. provisional application Ser. No. 62/819,679, filed on Mar. 18, 2019, and Taiwan application serial no. 108118893, filed on May 31, 2019. The entirety of each of the above-mentioned patent applications is hereby incorporated by reference herein and made a part of this specification.

BACKGROUND OF THE INVENTION

1. Field of the Invention

The present invention generally relates to a magnetic field sensing apparatus.

2. Description of Related Art

With the development of science and technology, electronic products with navigation and positioning functions are becoming more and more diverse. Electronic compasses provide the same function as traditional compasses in the application field of vehicle navigation, flight and personal handheld devices. In order to realize the function of electronic compasses, magnetic field sensing apparatus has become a necessary electronic component.

In a common magnetic field sensing apparatus, a corresponding coil is usually mounted beside a full Wheatstone bridge, and the coil is used to reset/set the magnetic field direction of the magnetic sensing element in the full-bridge. If the magnetic field components in three different directions need to be measured, then the magnetic field sensing apparatus needs three coils and related circuits for controlling the corresponding coils. Because the development trend of hand-held devices is toward miniaturization, and the number of coils and circuits used in existing magnetic field sensing apparatuses are more, which leads to complex circuit design and is not conducive to the application of magnetic field sensing apparatuses. Therefore, how to fabricate a high-efficiency magnetic field sensing apparatus with a simple circuit in a small area has become one of the development directions for one skilled in the art.

SUMMARY OF THE INVENTION

Accordingly, the present invention provides a magnetic field sensing apparatus, which has the advantages of simple circuit design and high response speed.

One embodiment of the present invention provides a magnetic field sensing apparatus, comprising a substrate, a plurality of magnetoresistance sensors and a plurality of magnetization direction setting devices. The surface has a surface. The surface comprises a plurality of inclined surfaces and a plane surface. The magnetoresistance sensors comprise a plurality of first magnetoresistance sensors disposed on the plurality of inclined surfaces and a plurality of second magnetoresistance sensors disposed on the plane surface. The first magnetoresistance sensors comprise a first portion and a third portion, and form a first full Wheatstone bridge. The second magnetoresistance sensors comprise a second portion and a fourth portion, and form a second full Wheatstone bridge. The magnetization direction setting devices comprise a first magnetization direction setting device and a second magnetization direction setting device. The first magnetization direction setting device is disposed beside the first portion and the second portion, and overlaps with the first portion and the second portion. The second magnetization direction setting device is disposed beside the third portion and the fourth portion, and overlaps with the third portion and the fourth portion.

In one embodiment of the present invention, the magnetic field sensing apparatus further comprises a current generator. The current generator is configured to selectively apply current to the plurality of magnetization direction setting devices.

In one embodiment of the present invention, a plurality of first bridge arms are formed between every two of the first magnetoresistance sensors, and the first bridge arms are respectively disposed on the plurality of inclined surfaces.

In one embodiment of the present invention, each of the first bridge arm comprises the first magnetoresistance sensor belonging to the first portion and the first magnetoresistance sensor belonging to the third portion.

In one embodiment of the present invention, a plurality of second bridge arms are formed between every two of the second magnetoresistance sensors, and the second bridge arms are disposed on the plane surface.

In one embodiment of the present invention, each of the second bridge arm comprises the second magnetoresistance sensor belonging to the second portion and the second magnetoresistance sensor belonging to the fourth portion.

In one embodiment of the present invention, the magnetoresistance sensors further comprise a plurality of third magnetoresistance sensors. The third magnetoresistance sensors are disposed on the plane surface. The magnetization direction setting devices further comprise a third magnetization direction setting device and a fourth magnetization direction setting device. The third magnetoresistance sensors comprise a fifth portion and a sixth portion, and form a third full Wheatstone bridge. The third magnetization direction setting device is disposed beside the fifth portion and overlaps with the fifth portion. The fourth magnetization direction setting device is disposed beside the sixth portion and overlaps with the sixth portion.

In one embodiment of the present invention, a plurality of third bridge arms are formed between every two of the plurality of third magnetoresistance sensors, the magnetization direction setting devices further comprise the third magnetization direction setting device and the fourth magnetization direction setting device. The third magnetization direction setting device is disposed beside the first portion and the second portion, and overlaps with the first portion and the second portion. The fourth magnetization direction setting device is disposed beside the third portion and the fourth portion, and overlaps with the third portion and the fourth portion.

Based on the above, in the magnetic field sensing apparatus provided by the embodiment of the present invention, the first magnetization direction setting device and the second magnetization direction setting device are respectively disposed at different portions of the first full Wheatstone bridge and the second full Wheatstone bridge in an overlapping manner, so the first magnetization direction setting device and the second magnetization direction setting device can simultaneously set/reset the magnetoresistance sensors in the two full Wheatstone bridges, such that the magnetic field sensing apparatus can use fewer magnetization direction setting devices and thus has the advantage of simple circuit design.

In order to make the foresaid features and advantages of the present invention more obvious and understandable, the following embodiments are provided for detail description with reference to the accompanying drawings.

DESCRIPTION OF THE EMBODIMENTS

Figure 1:
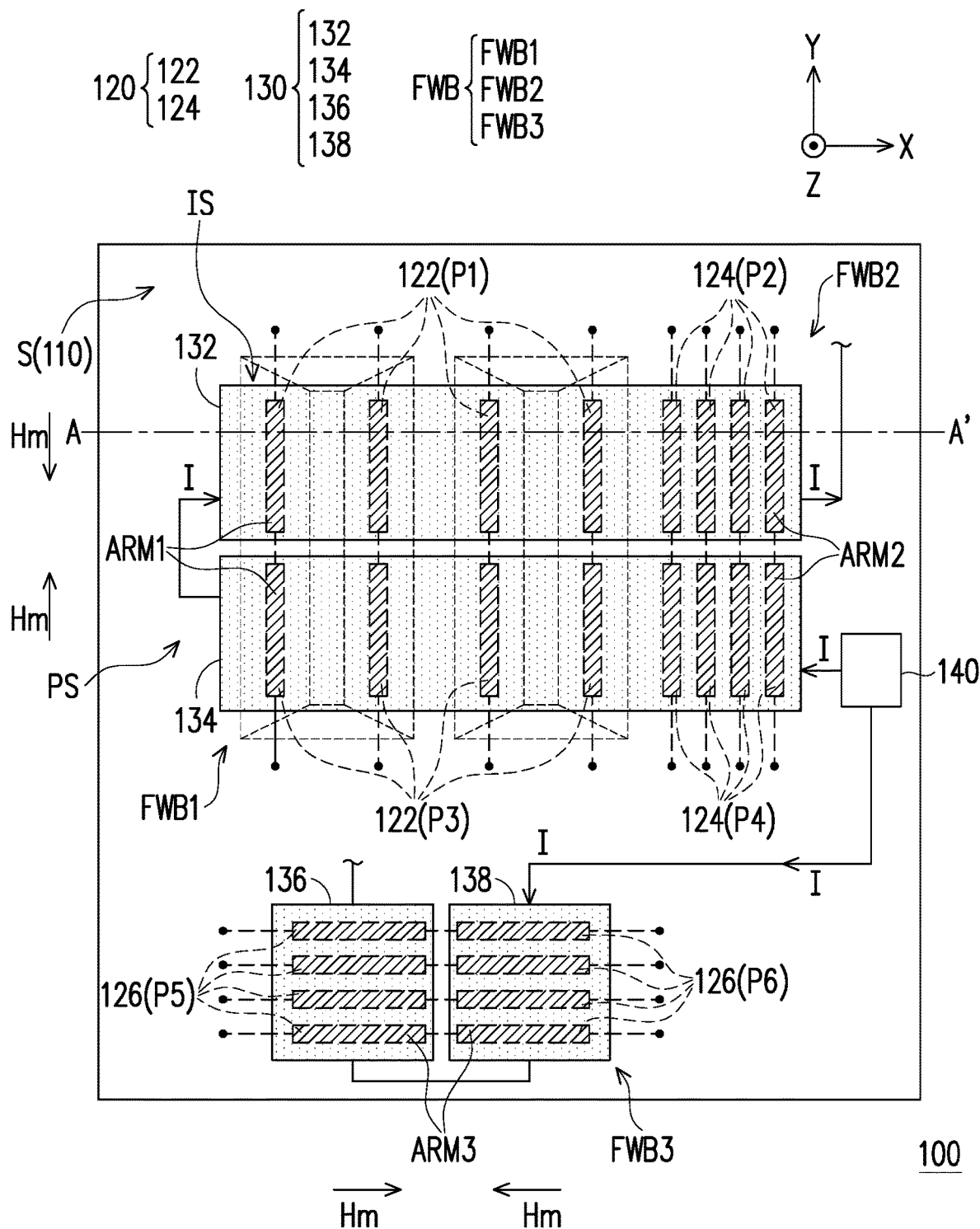
FIG. 1 illustrates a top view of a magnetic field sensing apparatus according to the present invention.
Figure 2:
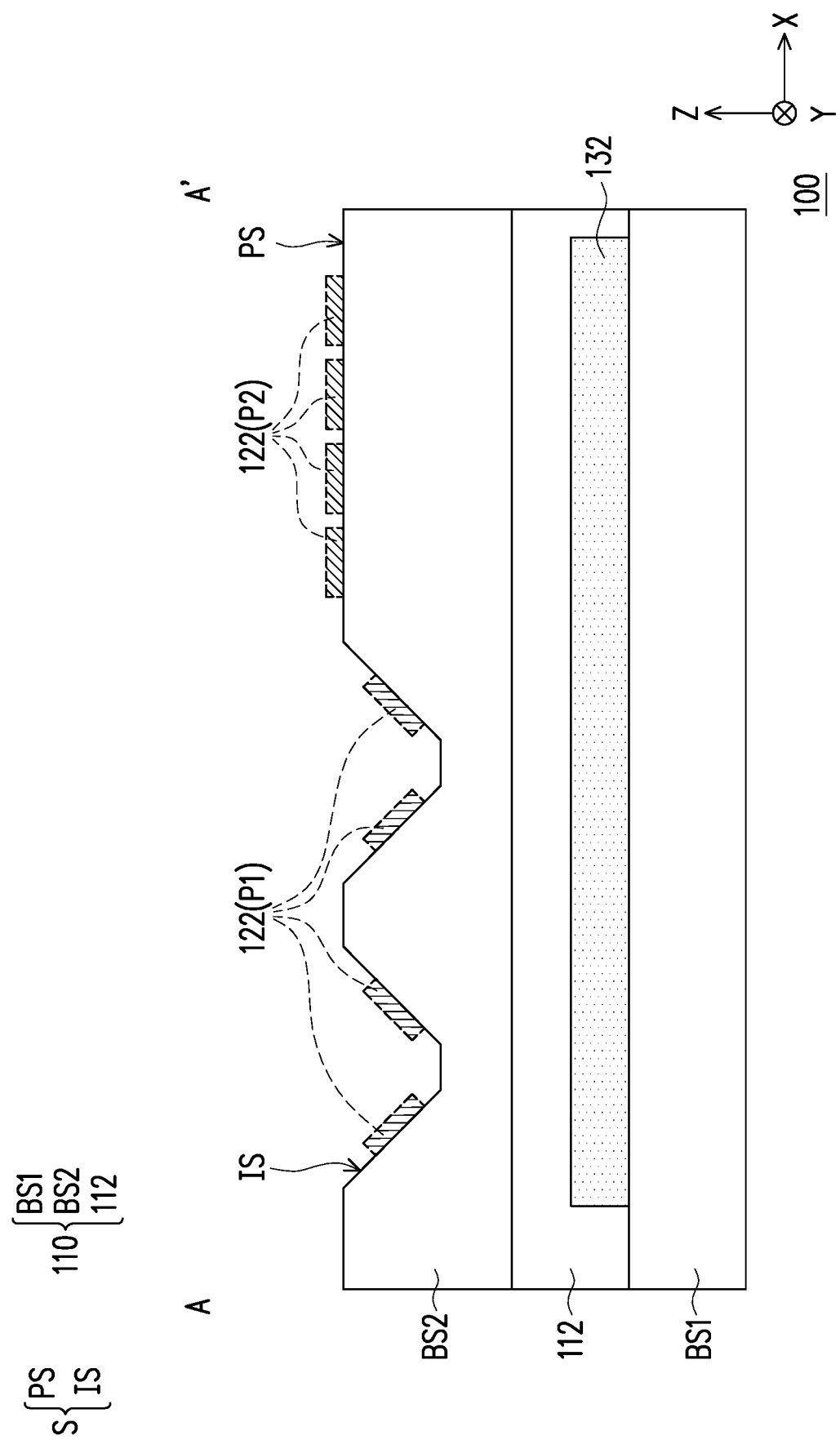
FIG. 2 illustrates a cross-sectional view of a cross section A-A' in FIG. 1.
Figure 3A:
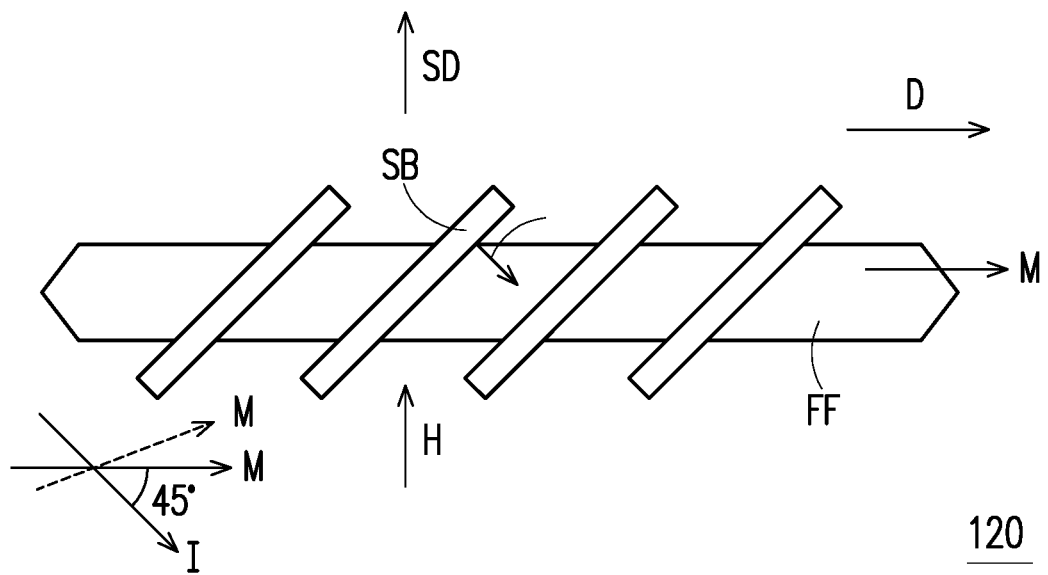
FIG. 3A and FIG. 3B illustrate different layouts of anisotropic magnetoresistance sensors in FIG. 1.
Figure 3B:
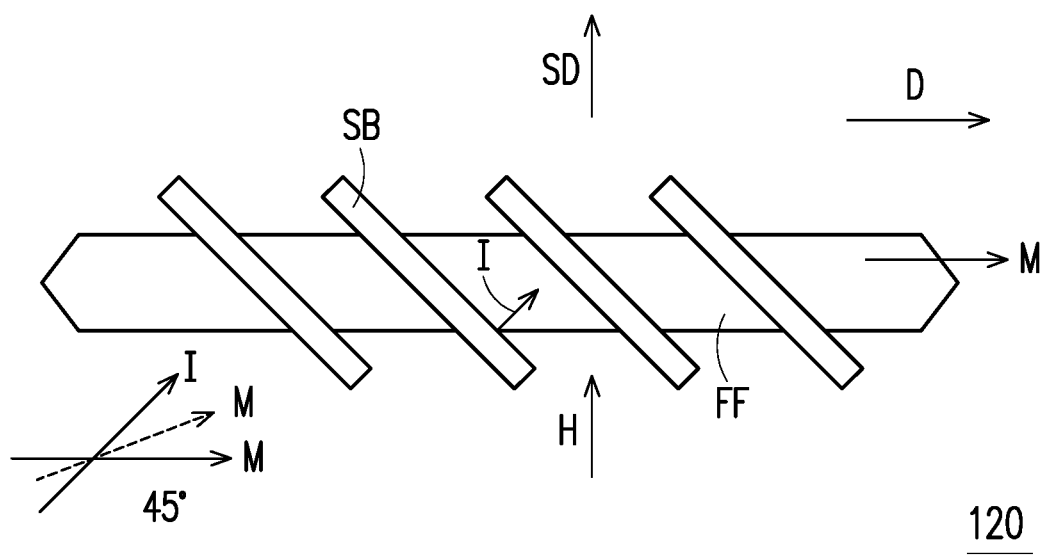

FIG. 1 illustrates a top view of a magnetic field sensing apparatus according to the present invention. FIG. 2 illustrates a cross-sectional view of a cross section A-A' in FIG. 1. FIG. 3A and FIG. 3B illustrate different layouts of anisotropic magnetoresistance sensors in FIG. 1.

Please refer to FIG. 1 and FIG. 2. In the present embodiment, a magnetic field sensing apparatus 100 comprises a substrate 110, a plurality of magnetoresistance sensors 120, a plurality of magnetization direction setting devices 130 and a current generator 140. The above components will be described in detail in the following paragraphs.

In the embodiment of the present invention, the substrate 110, for example, is a silicon substrate comprising blank silicon, a glass substrate or a silicon substrate with an integrated circuit, and the present invention is not limited thereto. Please refer to FIG. 2. The substrate 110 comprises a first substrate BS1, an insulating layer 112 and a second substrate BS2, wherein the insulating layer 112 is located between the first substrate BS1 and the second substrate BS2. The material of the insulating layer 112 is, for example, silicon dioxide, aluminium oxide, aluminium nitride, silicon nitride or other materials with an insulating function, and the present invention is not limited thereto. The surface S of the second substrate BS2 comprises a plurality of inclined surfaces IS and a plane surface PS connected with the inclined surfaces IS, wherein the inclined surfaces IS are inclined relative to the plane surface PS, and the number of the inclined surfaces IS is, but not limited to, four, for example.

In the embodiment of the present invention, the magnetoresistance sensors 120 (the areas of which are represented by oblique lines) refer to sensors with resistance that is capable of corresponding changing with the change of an external magnetic field. The magnetoresistance sensors 120 may be Anisotropic Magnetoresistance sensors (AMR sensors). Referring to FIG. 3A and FIG. 3B, the anisotropic magnetoresistance sensors 120 have, for example, a barber pole structure, i.e., a plurality of electrical shorting bars SB extended at a 45-degree angle relative to the extension direction D of the anisotropic magnetoresistance sensors 120. The electrical shorting bars SB are spaced apart from each other and are disposed in parallel to each other on a ferromagnetic film FF. The ferromagnetic film FF is a main body of the anisotropic magnetoresistance sensors 120, and its extension direction is the extension direction of the anisotropic magnetoresistance sensors 120. The sensing direction SD of the anisotropic magnetoresistance sensors 120 is perpendicular to the extension direction D. In addition, the relative two ends of the ferromagnetic film FF may be tapered.

In the embodiment of the present invention, the magnetization direction setting devices 130 (the areas of which are represented by dots) may be coils, wires, metal sheets, conductors or combinations thereof that generate a magnetic field by electrification. The number of the magnetization direction setting devices 130 is, for example, four, and the four magnetization direction setting devices are respectively referred to as first to fourth magnetization direction setting devices 132, 134, 136, 138.

In the embodiment of the present invention, the current generator 140 refers to an electronic component used for providing current.

In order to illustrate the configuration effect of the magnetic field sensing apparatus 100 in the present embodiment, the basic principle of measuring the magnetic field by using the magnetic field sensing apparatus 100 in the present embodiment will be briefly introduced in the following paragraphs.

Before starting to measure an external magnetic field H, the magnetization direction of the anisotropic magnetoresistance sensors 120 may be determined by means of the magnetization direction setting devices 130. In FIG. 3A, the magnetization direction setting devices 130 may generate a magnetic field along the extension direction D (or called as the long axis direction) through electrification, such that the anisotropic magnetoresistance sensors 120 have a magnetization direction M.

Next, the magnetization direction setting devices 130 are not electrified, such that the anisotropic magnetoresistance sensors 120 start to measure the external magnetic field H. When no external magnetic field H exists, the magnetization direction M of the anisotropic magnetoresistance sensors 120 is maintained in the extension direction D. At this moment, the current generator 140 may apply a current I to make the current I flow from the left end to the right end of the anisotropic magnetoresistance sensors 120, and thus the flow direction of the current I near the electrical shorting bars SB is perpendicular to the extension direction of the electrical shorting bars SB, such that the flow direction of the current I near the electrical shorting bars SB and the magnetization direction M form an included angle of 45 degrees. At this moment, the resistance of the anisotropic magnetoresistance sensors 120 is R.

When an external magnetic field H exists in a direction perpendicular to the extension direction D, the magnetization direction M of the anisotropic magnetoresistance sensors 120 will deflect towards the direction of the external magnetic field H, such that the included angle between the magnetization direction and the flow direction of the current I near the electrical shorting bars is greater than 45 degrees. At this moment, the resistance of the anisotropic magnetoresistance sensors 120 changes by −ΔR, i.e., becomes R−ΔR, that is, the resistance becomes smaller, where ΔR is greater than 0.

However, as illustrated in FIG. 3B, when the extension direction of the electrical shorting bars SB in FIG. 3B is set to form an included angle of 90 degrees with the extension direction of the electrical shorting bars SB in FIG. 3A (at this moment, the extension direction of the electrical shorting bars SB in FIG. 3B and the extension direction D of the anisotropic magnetoresistance sensors 120 still form an included angle of 45 degrees), and when an external magnetic field H exists and the magnetic field H will still deflect the magnetization direction M towards the direction of the external magnetic field H, the included angle between the magnetization direction M and the flow direction of the current I near the electrical shorting bars SB is smaller than 45 degrees, such that the resistance of the anisotropic magnetoresistance sensors 120 becomes R+ΔR, that is, the resistance of the anisotropic magnetoresistance sensors 120 becomes greater.

In addition, when the magnetization direction M of the anisotropic magnetoresistance sensors 120 is set to an opposite direction illustrated in FIG. 3A by means of the magnetization direction setting devices 130, the resistance of the anisotropic magnetoresistance sensors 120 in FIG. 3A under the external magnetic field H becomes R+AR. Furthermore, when the magnetization direction M of the anisotropic magnetoresistance sensors 120 is set to an opposite direction illustrated in FIG. 3B by means of the magnetization direction setting devices 130, the resistance of the anisotropic magnetoresistance sensors 120 in FIG. 3B under the external magnetic field H becomes R−ΔR.

Therefore, one skilled in the art measure the magnetic field component signals of the external magnetic field H in different directions according to the magnetoresistance sensors 120 in combination with the circuit design of full Wheatstone bridge.

Accordingly, it can be seen that, before measuring the external magnetic field H, it is necessary to set the magnetization direction of the magnetoresistance sensors 120 by means of the magnetization direction setting devices 130. The configuration effects of the present embodiment will be described in detail in the following paragraphs.

The configuration of each component in the magnetic field sensing apparatus 100 in the present embodiment will be described in detail in the following paragraphs.

Please refer to FIG. 1 and FIG. 2. In the present embodiment, the magnetoresistance sensors 120 respectively form three full Wheatstone bridges FWB, which are respectively called as first full Wheatstone bridge FWB1, second full Wheatstone bridge FWB2 and third full Wheatstone bridge FWB3. The magnetoresistance sensors 120 may be divided into a plurality of first magnetoresistance sensors 122, a plurality of second magnetoresistance sensors 124 and a plurality of third magnetoresistance sensors 126 according to the attribution relationship of different full Wheatstone bridge FWB1 to FWB3, wherein the first magnetoresistance sensors 122 are used for forming the first full Wheatstone bridge FWB1, and the second magnetoresistance sensors 124 are for forming the second full Wheatstone bridge FWB2, and the third magnetoresistance sensors 126 are used for forming the third full Wheatstone bridge FWB3. The first magnetoresistance sensors 122 and second magnetoresistance sensors 124 are arranged in the X-axis direction and extend in the Y-axis direction. The third magnetoresistance sensors 126 are arranged in the Y-axis direction and extend in the X-axis direction. The first magnetoresistance sensors 122 are disposed on a plurality of inclined surfaces IS, while the second magnetoresistance sensors 124 and third magnetoresistance sensors 126 are respectively disposed at different positions of the plane surface PS. Specifically, the second magnetoresistance sensors 124 are disposed on the right of the first magnetoresistance sensors 122, and the third magnetoresistance sensors 126 are set below the first magnetoresistance sensors 122. In other words, the magnetic field sensing apparatus 100 comprises one full Wheatstone bridge, i.e., the first full Wheatstone bridge FWB1 on the inclined surfaces IS, and two full Wheatstone bridges, i.e., the second full Wheatstone bridge FWB2 and third full Wheatstone bridge FWB3 on the plane surface PS.

In detail, the first magnetoresistance sensors 122 comprise a first portion P1 and a third portion P3, depending on the magnetization direction setting method. The second magnetoresistance sensors 124 comprise a second portion P2 and a fourth portion P4. The third magnetoresistance sensors 126 comprise a fifth portion P5 and a sixth portion P6. In the following paragraphs, the relationship between the magnetoresistance sensors 120, the magnetization direction setting devices 130 and the full Wheatstone bridges FWB will be described paragraph by paragraph.

The first magnetization direction setting device 132 is disposed beside the first portion P1 and the second portion P2 (e.g., below, but not limited thereto), and overlaps with the first portion P1 and the second portion P2. That is to say, the first magnetization direction setting device 132 is disposed at the first portion P1 belonging to the first full Wheatstone bridge FWB1 and the second portion P2 belonging to the second full Wheatstone bridge FWB2 in an overlapping manner.

The second magnetization direction setting device 134 is disposed beside the third portion P3 and the fourth portion P4 (not shown, e.g., below, but not limited thereto), and overlaps with the third portion P3 and the fourth portion P4. That is to say, the second magnetization direction setting device 134 is disposed at the third portion P3 belonging to the first full Wheatstone bridge FWB1 and the fourth portion P4 belonging to the second full Wheatstone bridge FWB2 in an overlapping manner.

The third magnetization direction setting device 136 and the fourth magnetization direction setting device 138 are disposed beside the fifth portion P5 and the sixth portion P6 (not shown, e.g., below, but not limited thereto). That is to say, the third magnetization direction setting device 136 and fourth magnetization direction setting device 138 are disposed at different portions, i.e., the fifth portion P5 and the sixth portion P6 belonging to the same third full Wheatstone bridge FWB3.

In the first full Wheatstone bridge FWB1, a plurality of first bridge arms ARM1 (e.g., four, shown only by one reference sign) are formed between every two of the plurality of first magnetoresistance sensors 122. In other words, two first magnetoresistance sensors 122 form a first bridge arms ARM1. The first bridge arms ARM1 are respectively disposed on the inclined surfaces IS. Each of the first bridge arm ARM1 comprises the first magnetoresistance sensor 122 belonging to the first portion P1 and the first magnetoresistance sensor 122 belonging to the third portion P3. With reference to FIG. 1, from another point of view, each of the first bridge arm ARM1 overlaps with the first magnetization direction setting device 132 and the second magnetization direction setting device 134.

In the second full Wheatstone bridge FWB2, a plurality of second bridge arms ARM2 (e.g., four, shown only by one reference sign) are formed between every two of the plurality of second magnetoresistance sensors 124. In other words, two second magnetoresistance sensors 124 form a second bridge arms ARM2. The second bridge arms ARM2 are respectively disposed on the plane surface PS. Each of the second bridge arm ARM2 comprises the second magnetoresistance sensor 124 belonging to the second portion P2 and the second magnetoresistance sensor 124 belonging to the fourth portion P4. With reference to FIG. 1, from another point of view, each of the second bridge arm ARM2 overlaps with the first magnetization direction setting device 132 and the second magnetization direction setting device 134.

In the third full Wheatstone bridge FWB3, a plurality of third bridge arms ARM3 (e.g., four, shown only by one reference sign) are formed between every two of the third magnetoresistance sensors 126. In other words, two third magnetoresistance sensors 126 form a third bridge arms ARM3. The third bridge arms ARM3 are respectively disposed on the plane surface PS at positions different from the positions of the second bridge arms ARM2. Each of the third bridge arm ARM3 comprises the third magnetoresistance sensor 126 belonging to the fifth portion P5 and the third magnetoresistance sensor 126 belonging to the sixth portion P6. With reference to FIG. 1, from another point of view, each of the third bridge arm ARM3 overlaps with the third magnetization direction setting device 136 and the fourth magnetization direction setting device 138.

The current generator 140 is further coupled with the plurality of magnetization direction setting devices 130 and is used for selectively applying a current I to the magnetization direction setting devices 130. The current generator 140 is coupled with the first magnetization direction setting device 132 and the second magnetization direction setting device 134 by means of wires to form an S-shaped loop. The current generator 140 is also coupled with the third magnetization direction setting device 136 and the fourth magnetization direction setting device 138 by means of wires to form another S-shaped loop.

Through the above configuration, the current generator 140 may respectively provide the first magnetization direction setting device 132 and the second magnetization direction setting device 134 with the current I to the positive X-axis direction and negative X-axis direction, and the current generator 140 may respectively provide the third magnetization direction setting device 136 and the fourth magnetization direction setting device 138 with the current I to the positive Y-axis direction and negative Y-axis direction. In other words, the flow directions of the current I provided by the current generator 140 in the first magnetization direction setting device 132 and the second magnetization direction setting device 134 are anti-parallel, and the set magnetic fields $H_m$ generated by the current I are also anti-parallel. The third magnetization direction setting device 136 and the fourth magnetization direction setting device 138 are also similar to the first magnetization direction setting device 132 and the second magnetization direction setting device 134, except that the current flow direction and the direction of the magnetic field $H_m$ are different from that of the first magnetization direction setting device 132 and the second magnetization direction setting device 134. The descriptions thereof are omitted herein.

In addition, in the first magnetization direction setting device 132 and the second magnetization direction setting device 134 illustrated in FIG. 1, the flow directions of the current I are respectively positive X-axis direction and negative X-axis direction. The magnetic field sensing apparatus 100 may also comprise a switching circuit (not shown), and the switching circuit is coupled with the current generator 140 and the magnetization direction setting devices 130, and provides a current path switching function to respectively adjust the flow direction of the current I in the first magnetization direction setting device 132 and the second magnetization direction setting device 134 to the negative X-axis direction and the positive X-axis direction. Thus, the direction of the set magnetic field $H_m$ is changed, and then the magnetization direction of each magnetoresistance sensor 120 is set/reset. Similarly, the switching circuit can also respectively adjust the flow direction of the current I in the second magnetization direction setting device 136 and the fourth magnetization direction setting device 138 to the negative Y-axis direction and the positive Y-axis direction, so as to change the direction of the set magnetic field $H_m$.

Accordingly, before the magnetic field sensing apparatus 100 detects the detection of the external magnetic field, one skilled in the art can set/reset the magnetization directions of the magnetoresistance sensors 120 in the first full Wheatstone bridge FWB1, the second full Wheatstone bridge FWB2 and the third full Wheatstone bridge FWB3, then further place the magnetic field sensing apparatus 100 in the external magnetic field, measure the magnetic field component in the Z-axis direction according to the electric signal output by the first full Wheatstone bridge FWB1 in response to the external magnetic field, measure the magnetic field component in the X-axis direction according to the electric signal output by the second full Wheatstone bridge FWB2 in response to the external magnetic field, and measure the magnetic field component in the Y-axis direction according to the electric signal output by the third full Wheatstone bridge FWB3 in response to the external magnetic field. Accordingly, the magnetic field sensing apparatus 100 in the present embodiment can measure the magnetic field components in the directions of the three axes.

It should be noted that, in the above embodiment, the magnetic field sensing apparatus 100 has three full Wheatstone bridges FWB1 to FWB3, and thus can detect the magnetic field components in the directions of the three axes. In other embodiments, the magnetic field sensing apparatus may also have the first full Wheatstone bridge FWB1 and second full Wheatstone bridge FWB2 and does not have the full Wheatstone bridge FWB3, i.e., can detect the magnetic field components in the directions of two axes. The present invention is not limited thereto.

Based on the above, in the magnetic field sensing apparatus according to the embodiment of the present invention, a plurality of first magnetoresistance sensors comprise a first portion and a third portion and form a first full Wheatstone bridge, and a plurality of second magnetoresistance sensors comprise a second portion and a fourth portion and form a second full Wheatstone bridge. A first magnetization direction setting device is disposed beside the first portion belonging to the first full Wheatstone bridge and the second portion belonging to the second full Wheatstone bridge, and overlaps with the first portion and the second portion. A second magnetization direction setting device is disposed beside the third portion belonging to the first full Wheatstone bridge and the fourth portion belonging to the second full Wheatstone bridge, and overlaps with the third portion and the fourth portion. The magnetic field sensing apparatus can set/reset the magnetization direction of the magnetoresistance sensors in two full Wheatstone bridges simultaneously by means of the first magnetization direction setting device and the second magnetization direction setting device, so the number of magnetization direction setting devices can be reduced, and the circuit design is simpler. Moreover, since the first magnetization direction setting device and the second magnetization direction setting device can simultaneously set/reset the first magnetoresistance sensors in the first full Wheatstone bridge and the second magnetoresistance sensors in the second full Wheatstone bridge, the magnetic field sensing apparatus has a faster response speed.

Although the present invention has been disclosed as above by means of the embodiment, it is not intended to limit the present invention. One skilled in the art may make various variations and modifications without departing from the spirit and scope of the present invention. Therefore, the protection scope of the present invention shall be defined by the scope of the patent application appended hereto.

What is claimed is:

1. A magnetic field sensing apparatus, comprising:
a substrate, having a surface, the surface comprising a plurality of inclined surfaces and a plane surface;
a plurality of magnetoresistance sensors, comprising a plurality of first magnetoresistance sensors disposed on the plurality of inclined surfaces and a plurality of second magnetoresistance sensors disposed on the plane surface, wherein,
the plurality of first magnetoresistance sensors comprises a first portion and a third portion, and form a first full Wheatstone bridge,
the plurality of second magnetoresistance sensors comprises a second portion and a fourth portion, and form a second full Wheatstone bridge; and
a plurality of magnetization direction setting devices, comprising a first magnetization direction setting device and a second magnetization direction setting device,
wherein,
the first magnetization direction setting device is disposed beside the first portion and the second portion, and overlaps with the first portion and the second portion;
the second magnetization direction setting device is disposed beside the third portion and the fourth portion, and overlaps with the third portion and the fourth portion.

2. The magnetic field sensing apparatus according to claim 1, further comprising a current generator configured to selectively apply current to the plurality of magnetization direction setting devices.

3. The magnetic field sensing apparatus according to claim 1, wherein a plurality of first bridge arms are formed between every two of the first magnetoresistance sensors, and the plurality of first bridge arms are respectively disposed on the plurality of inclined surfaces.

4. The magnetic field sensing apparatus according to claim 3, wherein,
each of the first bridge arm comprises the first magnetoresistance sensor belonging to the first portion and the first magnetoresistance sensor belonging to the third portion.

5. The magnetic field sensing apparatus according to claim 1, wherein a plurality of second bridge arms are formed between every two of the second magnetoresistance sensors, and the plurality of second bridge arms are disposed on the plane surface.

6. The magnetic field sensing apparatus according to claim 5, wherein each of the second bridge arm comprises the second magnetoresistance sensor belonging to the second portion and the second magnetoresistance sensor belonging to the fourth portion.

7. The magnetic field sensing apparatus according to claim 1, wherein the plurality of magnetoresistance sensors further comprise a plurality of third magnetoresistance sensors, the plurality of third magnetoresistance sensors are disposed on the plane surface,
the plurality of magnetization direction setting devices further comprise a third magnetization direction setting device and a fourth magnetization direction setting device,
wherein the plurality of third magnetoresistance sensors comprise a fifth portion and a sixth portion, and form a third full Wheatstone bridge,
wherein,
the third magnetization direction setting device is disposed beside the fifth portion and overlaps with the fifth portion; and
the fourth magnetization direction setting device is disposed beside the sixth portion and overlaps with the sixth portion.

8. The magnetic field sensing apparatus according to claim 7, wherein,
a plurality of third bridge arms are formed between every two of the plurality of third magnetoresistance sensors, the plurality of magnetization direction setting devices further comprise the third magnetization direction setting device and the fourth magnetization direction setting device,
the third magnetization direction setting device is disposed beside the first portion and the second portion, and overlaps with the first portion and the second portion,
the fourth magnetization direction setting device is disposed beside the third portion and the fourth portion, and overlaps with the third portion and the fourth portion.

9. The magnetic field sensing apparatus according to claim 1, wherein the magnetoresistance sensors are anisotropic magnetoresistance sensors.

* * * * *